United States Patent
Dörrhöfer et al.

(10) Patent No.: US 6,905,361 B2
(45) Date of Patent: Jun. 14, 2005

(54) ELECTRICAL DEVICE

(75) Inventors: Stefan Dörrhöfer, Usingen (DE); Dietmar Schultz, Bad Homburg (DE); Michael Nitzschke, Hatterheim (DE)

(73) Assignee: Siemens Aktiengesellschaft, München (DE)

( * ) Notice: Subject to any disclaimer, the term of this patent is extended or adjusted under 35 U.S.C. 154(b) by 57 days.

(21) Appl. No.: 10/345,133

(22) Filed: Jan. 15, 2003

(65) Prior Publication Data

US 2003/0171026 A1 Sep. 11, 2003

(30) Foreign Application Priority Data

Jan. 21, 2002 (DE) .......................................... 102 02 095

(51) Int. Cl.⁷ ............................................. H01R 13/00
(52) U.S. Cl. ..................................... 439/485; 439/76.1
(58) Field of Search ............................... 439/485, 76.1, 439/762, 825, 8; 361/774, 707, 711; 174/52

(56) References Cited

U.S. PATENT DOCUMENTS 5,774,342 A * 6/1998 Brandenburg et al. ...... 361/774
6,494,723 B2 * 12/2002 Yamane et al. ............ 439/76.2

* cited by examiner

Primary Examiner—Alexander Gilman
(74) Attorney, Agent, or Firm—Martin A. Farber

(57) ABSTRACT

With an electrical device with a circuit arranged on a support plate and with a leadframe, forming electrical leads, for the electrical connection of the circuit to further electrical components, the support plate is in heat-conducting connection with at least a part of the leadframe. The leadframe may be formed at least partly with a flat surface area and the support plate may rest on the flat part. An electrical insulation between the support plate and the leadframe may be formed by a double-sided adhesive film or by a printed-on adhesive.

7 Claims, 3 Drawing Sheets

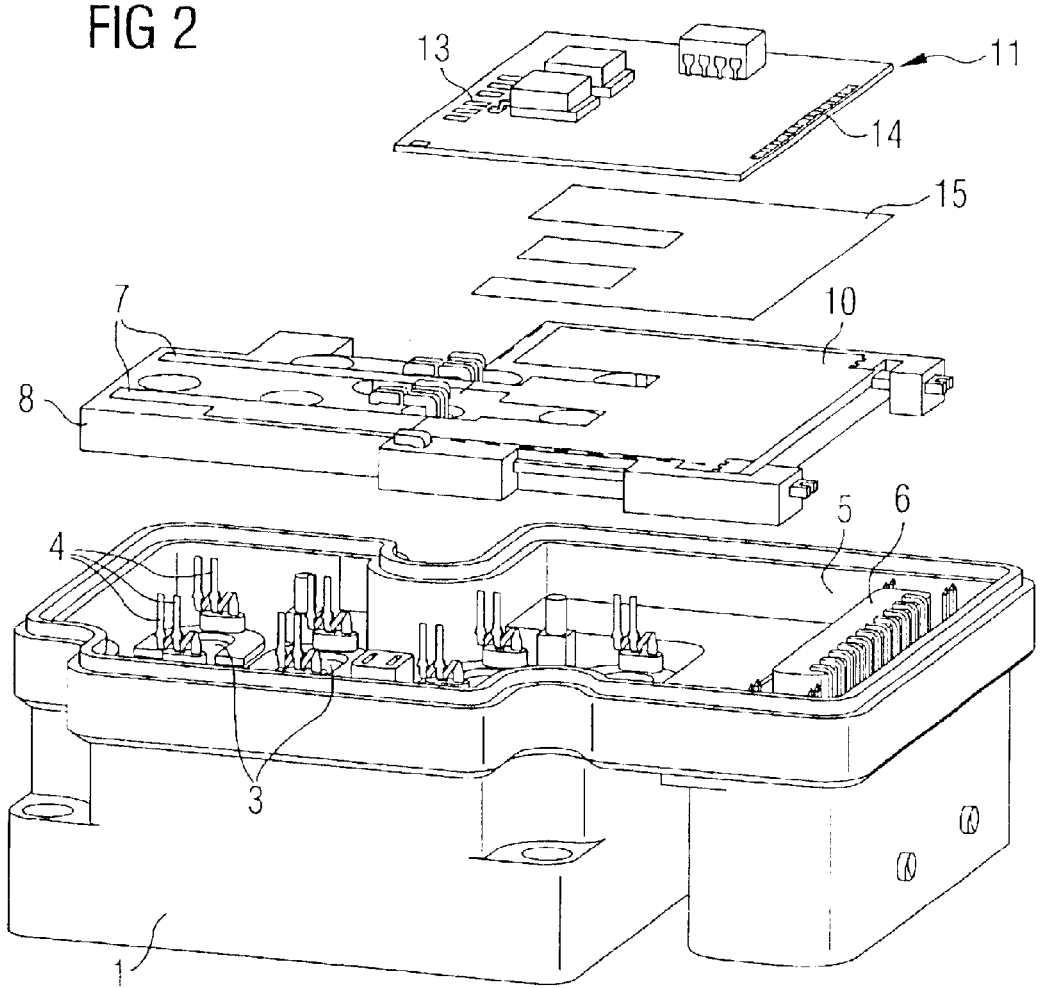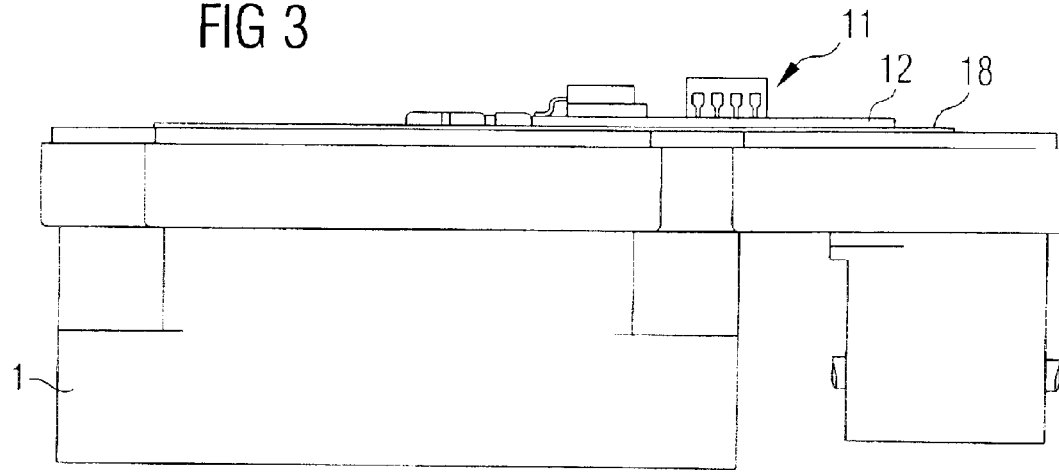

ELECTRICAL DEVICE

FIELD AND BACKGROUND OF THE INVENTION

The invention relates to an electrical device with a circuit arranged on a support plate and with a leadframe, forming electrical leads, for the electrical connection of the circuit to further electrical components.

In electrical devices, for example control devices for motor vehicles, so-called leadframes, which interconnect the corresponding components, such as coils and high-power semiconductor devices, are often used for conducting relatively high currents. More complex circuits of lower power are in this case respectively configured as hybrid circuits or by printed circuit technology on a support plate. In spite of lower power loss, these circuits require measures for dissipating the lost heat, which involves additional, often considerable expenditure. This heat dissipation is often hampered still further by the fact that the devices are arranged in closed housings.

SUMMARY OF THE INVENTION

The object of the present invention is to permit and/or improve the dissipation of the lost heat in circuits of this type with low costs.

This object is achieved according to the invention by the support plate being in heat-conducting connection with at least a part of the leadframe. In this case it is preferably provided that the leadframe is formed at least partly with a flat surface area and that the support plate rests on the flat part.

A significant improvement in the heat dissipation of electrical circuits, such as printed circuit boards and hybrid circuits, in closed housings is possible by the measures according to the invention. In this case, a component which is present in any case in these housings is used in an advantageous way as a heat sink and as a fastening means. This dispenses with further components for heat dissipation and for fastening the circuit.

For the fastening and electrical insulation of the circuit, it may be provided in particular that an electrical insulation between the support plate and the leadframe is formed by a double-sided adhesive film or by a printed-on or dispensed adhesive.

An advantageous refinement of the device according to the invention consists in that the leadframe is encapsulated in plastic, with electrical contact areas and areas intended for heat-conducting connection with the support plate being left free. Consequently, a stability and load-bearing capacity of the leadframe are achieved by measures known per se.

Simple and dependable contacting of the circuit with the leadframe is made possible in the case of another advantageous refinement of the device according to the invention by the leadframe taking up a larger surface area than the support plate and by leads of the leadframe which are intended for the circuit arranged on the support plate protruding as contact areas above the plane of the leadframe alongside the support plate.

An advantageous development of the device according to the invention consists in that the further electrical components are arranged in a housing, with electrical contact elements pointing in the direction of an open side of the housing and being connected to contact areas of the leadframe, that the plastic-encapsulated leadframe substantially takes up the open side of the housing, with the circuit arranged on the support plate facing outward, and that the housing can be closed by a cover which is designed for receiving at least the circuit. In the case of this development, simple assembly of the device and dependable mounting and fixing of the plastic-encapsulated leadframe are possible.

In the case of this development, it is preferably provided that the surface area of the leadframe intended for the heat conduction protrudes beyond the edge of the housing. This measure simplifies the application of the insulating and adhesive layer in series production. For example, a screen printing tool can easily be brought up to the surface area of the leadframe to be printed on, without the edge of the housing being disturbed or unintentionally printed on.

BRIEF DESCRIPTION OF THE DRAWINGS

The invention allows numerous embodiments. One of these is schematically represented in the drawing on the basis of several figures and is described below.

In the drawing:

FIG. 2 shows the exemplary embodiment with the leadframe additionally removed,

FIG. 3 shows a side view of the exemplary embodiment,

DETAILED DESCRIPTION OF THE PREFERRED EMBODIMENT

Figure 1:
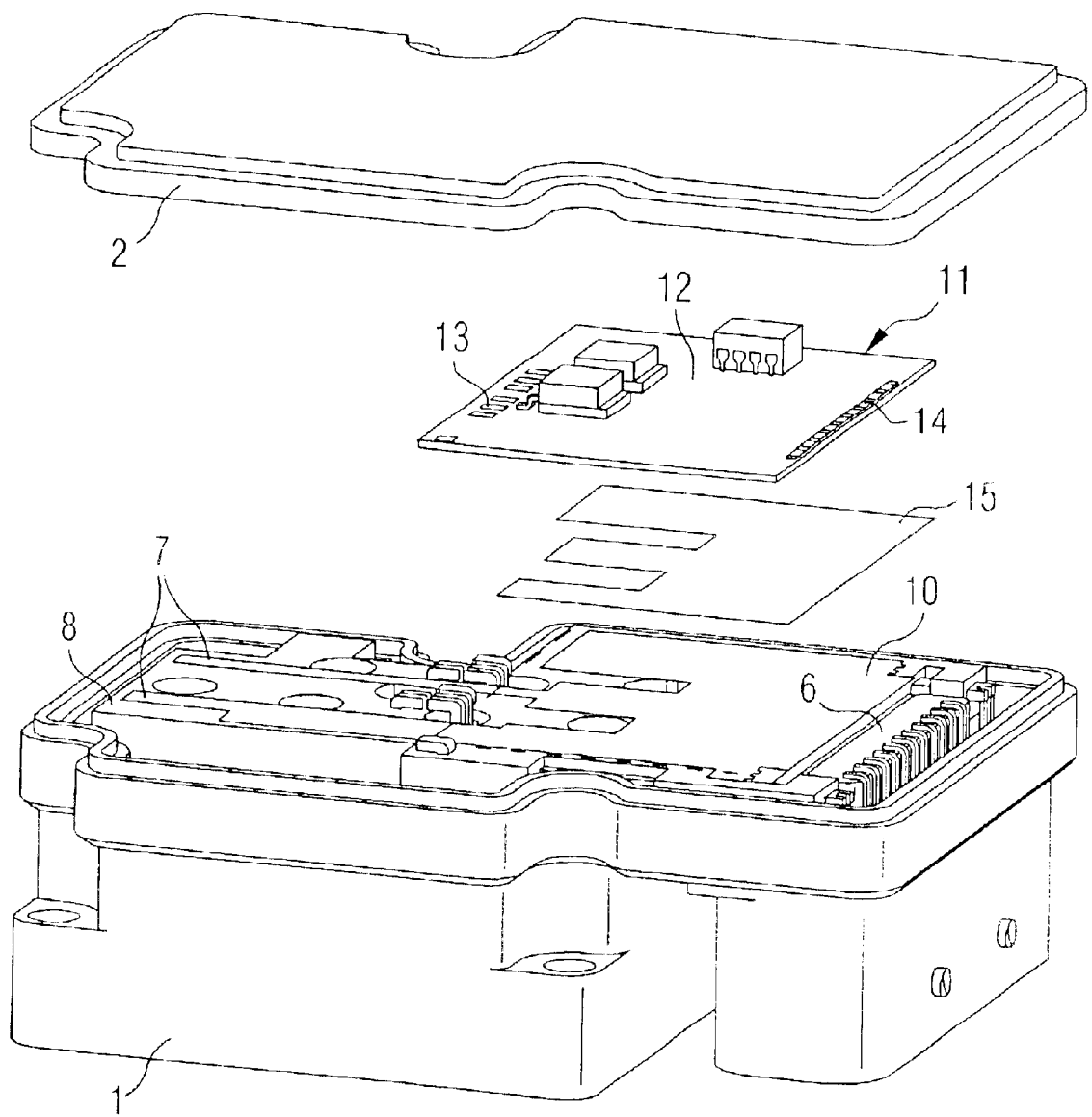
FIG. 1 shows a partly disassembled exemplary embodiment.
Figure 4:
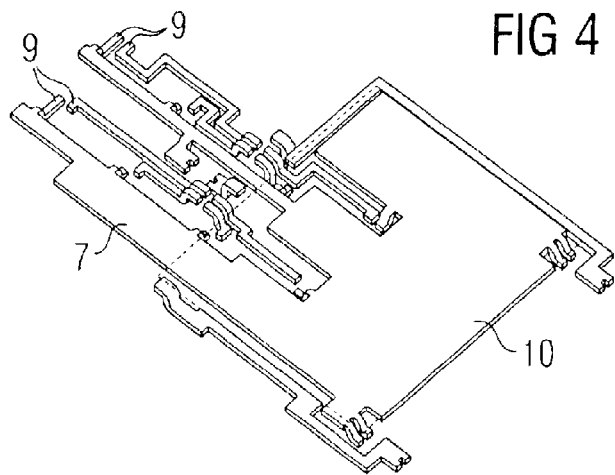
FIG. 4 shows the leadframe.
Figure 5:
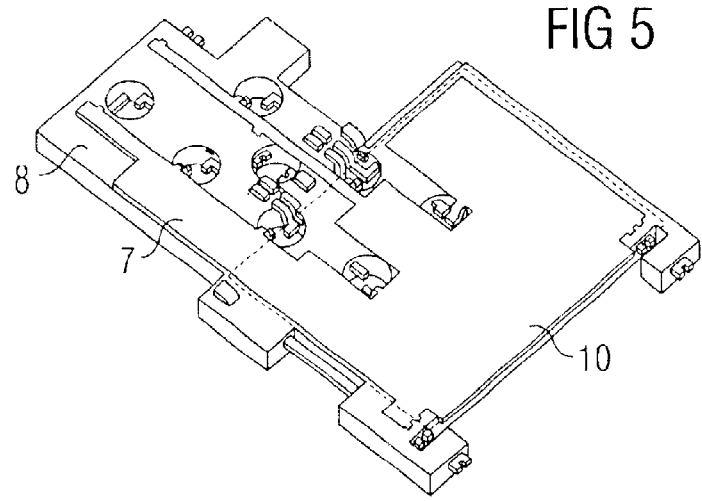
FIG. 5 shows the encapsulated leadframe.

The figures show a device according to the invention in a practical configuration, presenting a series of details which are not significant in connection with the invention and are therefore not described in any more detail. The same parts are provided in the figures with the same reference numerals.

The device represented comprises a housing 1 and a cover 2. Arranged in the housing are various electrical components 3, the terminal pins 4 of which point in the direction of the opening 5 of the housing 1. The housing also contains a plug-in connector 6. The leadframe 7 is encapsulated in plastic 8, so that it forms a stable component which can be fitted into the housing in such a way that welding lugs 9 of the leadframe 7 can be connected to the terminal pins 4 of the components 3. A part 10 of the leadframe 7 is formed with a flat surface area and serves for receiving a circuit 11 with a support plate 12, various components, which are only indicated, and contact areas 13, 14. For insulating and fastening the support plate 12, an adhesive insulating layer 15, which may either be a double-sided adhesive film or a paste which is applied in particular by the screen-printing process, is applied to the part 10 of the leadframe 7.

Figure 6:
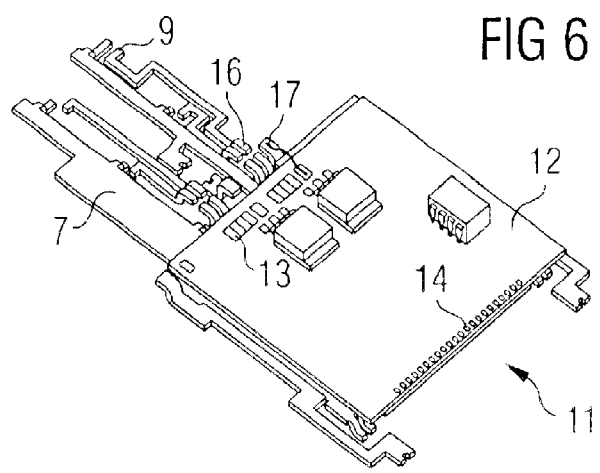
FIG. 6 shows the leadframe with an applied circuit.

Welding lugs 16 of the leadframe 7, which serve for the electrical connection to the circuit 11, are cranked in such a way that they lie approximately at the same height as the contact areas 13 of the circuit, and are provided with bondable surfaces. One of the bonding wires 17 is represented in FIG. 6.

The side view according to FIG. 3 reveals that the surface 18 of the leadframe serving as a cooling area for the circuit 11 protrudes slightly beyond the housing, so that the application of the adhesive, for example by the screen-printing process, is made easier.

We claim:

1. An electrical device with a circuit arranged on a support plate and with a leadframe, having integrally formed electrical leads, for the electrical connection of the circuit to further electrical components, wherein the support plate (12) is in heat-conducting connection with at least a part (10) whrerein the leadframe is encapsulated in plastic (8), with the leadframe leads forming electrical contact areas (9, 16) and areas intended for heat-conducting connection with the support plate (12) being left free of encapsulation of the leadframe (7), and wherein the leadframe (7) is formed at least partly with a flat surface area and the support plate (12) rests on the flat mart (10).

2. The device as claimed in claim 1, wherein an electrical insulation between the support plate (12) and the leadframe (7, 10) is formed by a double-sided adhesive film (15).

3. The device as claimed in claim 1, wherein an electrical insulation between the support plate (12) and the leadframe (7, 10) is formed by a printed-on adhesive.

4. The device as claimed in claim 3, wherein the leadframe (7) takes up a larger surface area than the support plate (12) and the leads of the leadframe (7) which are intended for the circuit (11) arranged on the support plate (12) protrude as the contact areas (16) above a plane of the leadframe alongside the support plate.

5. The device an claimed in claim 4, wherein the further electrical components (3) are arranged in a housing (1), with electrical contact elements (4) pointing ma direction of an open side (5) of the housing (1) and being connected to contact areas (9) of the leadframe (7), wherein the leadframe (7, 8) substantially takes up the open side (5) of the housing (1), with the circuit (11) arranged on the support plate (12) facing outward, and the housing (1) being closable by a cover (2) which is designed for receiving at least the circuit (11).

6. The device as claimed in claim 5, wherein a portion (18) of the flat surface area of the leadframe (7) intended to serve as a cooling area for the circuit (11) protrudes beyond an edge of the a larger portion of the housing (1), said larger portion encloses the electrical components (3).

7. An electrical device comprising:

a lead frame and a group of electrical components connecting electrically with the lead frame with integrally formed leads, said leadframe being substantially encapsulated in plastic;

a support plate, and an electric circuit disposed on the support plate, and a housing having a larger portion that encloses said group of electrical components and supports said lead frame;

wherein a portion of the lead frame has a receiving surface for receiving the support plate, and the lead frame includes connection elements for making electrical connection with the electric circuit upon emplacement of the support plate on the receiving surf ace of the lead frame, the receiving a non-encapsulated receiving surface of the lead frame is a flat surface; and the receiving surface port ion of the lead frame is thermally coupled via the support plate to the electric circuit for withdrawal of heat from the electric circuit into the lead frame to accomplish a cooling of the electric circuit into the portion of the flat surface of the lead frame protrudes beyond an edge of the larger portion the housing to serve as a cooling area for the electric circuit.

* * * * *